United States Patent
Maki et al.

(10) Patent No.: US 8,079,134 B2
(45) Date of Patent: Dec. 20, 2011

(54) METHOD OF ENHANCING ON-CHIP INDUCTANCE STRUCTURE UTILIZING SILICON THROUGH VIA TECHNOLOGY

(75) Inventors: Andrew Benson Maki, Rochester, MN (US); Gerald Keith Bartley, Rochester, MN (US); Philip Raymond Germann, Oronoco, MN (US); Mark Owen Maxson, Mantorville, MN (US); Darryl John Becker, Rochester, MN (US); Paul Eric Dahlen, Rochester, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 687 days.

(21) Appl. No.: 12/184,450

(22) Filed: Aug. 1, 2008

(65) Prior Publication Data

US 2010/0024202 A1 Feb. 4, 2010

(51) Int. Cl.
*H01F 7/127* (2006.01)
*B05D 1/00* (2006.01)

(52) U.S. Cl. ...... 29/602.1; 29/606; 29/603.23; 427/116; 427/117; 336/182; 336/208

(58) Field of Classification Search .......... 29/602.1, 29/606, 603.23, 603.24, 846; 427/116, 117; 336/182, 207, 208
See application file for complete search history.

(56) References Cited

U.S. PATENT DOCUMENTS

| 4,684,438 | A | * | 8/1987 | Lazzari | 29/603.24 |
| 5,793,272 | A | | 8/1998 | Burghartz et al. | |
| 5,852,866 | A | * | 12/1998 | Kuettner et al. | 29/602.1 |
| 6,441,715 | B1 | | 8/2002 | Johnson | |
| 6,947,291 | B2 | | 9/2005 | Chua et al. | |
| 7,061,359 | B2 | | 6/2006 | Ding et al. | |
| 7,132,829 | B2 | | 11/2006 | Hudson et al. | |
| 2002/0187662 | A1 | | 12/2002 | Biegelsen et al. | |
| 2005/0270135 | A1 | | 12/2005 | Chua et al. | |

FOREIGN PATENT DOCUMENTS

JP 59124115 A * 7/1984 ................... 29/602.1

* cited by examiner

*Primary Examiner* — A. Dexter Tugbang
(74) *Attorney, Agent, or Firm* — Robert R. Williams

(57) ABSTRACT

A method is provided that utilizes silicon through via technology, to build a Toroid into the chip with the addition of a layer of magnetic material such as Nickel above and below the T-coil stacked multi-ring structure. This allows the connection between the inner via and an array of outer vias. This material is added on a BEOL metal layer or as an external coating on the finished silicon. Depending on the configuration and material used for the via, the inductance will increase approximately two orders of magnitude (e.g., by utilizing a nickel via core). Moreover, a ferrite material with proper thermal conduction properties is used in one embodiment.

1 Claim, 4 Drawing Sheets

METHOD OF ENHANCING ON-CHIP INDUCTANCE STRUCTURE UTILIZING SILICON THROUGH VIA TECHNOLOGY

BACKGROUND OF THE INVENTION

Use of on-chip inductance structures (e.g., T-coils and inductors) in VLSI design is becoming more prevalent as design frequencies increase. These structures are metal-only devices within a chip where "coils" of metal are created on wiring layers in an attempt to create inductance. This inductance is useful in high speed applications that are performance-limited due to capacitive loading. Due to its nature, these structures have a low inductance per unit area; a recent design demonstrated ~1.5 nH per 2185 $um^2$ of area. One can/may increase the inductance per unit area of silicon Back End Of Line (BEOL) inductance structures such as T-coils and inductors.

The spiral of prior art does not allow for the use of external ferrites, and in the one instance does not have each coil of the spiral an equal distance from the core. Thus the flux linking thru the core is not optimized. Further, the prior art fundamentally provides for flux linkage thru horizontal structures, i.e., not utilizing a more vertical structure to reduce surface area for a given inductance.

Another prior art teaches a planar inductor with orthogonal windings, intermingled and encased in magnetic materials. It includes teaching regarding vapor deposition of materials wherein, the core is formed primarily thru flat plates, and intermingled strips of "magnetic" materials.

Another prior art teaches a planar spiral inductor around a core formed by photoresist etching and a horizontal spiral around a patterned core.

SUMMARY OF THE INVENTION

Utilizing Silicon through via technology, a magnetic material (like Nickel) is filled into a via that extends vertically down the center of the BEOL inductance structure.

This results in an up to 100× increase in the inductance per unit area that is linear with the permeability of the via material relative to the permeability of the BEOL dielectric material.

An embodiment of the invention is to utilize silicon through via technology, to build a Toroid into the chip with the addition of a layer of magnetic material like Nickel above and below the T-coil structure. This allows the connection between the inner via and an array of outer vias. This material could be added on a BEOL metal layer, or as an external coating on the finished silicon. In this embodiment a ferrite material with proper thermal conduction properties is used. The inductance adder per unit area is significant. Depending on the configuration and material used for the via, inductance will increase approximately two orders of magnitude, e.g., by utilizing a nickel via core.

An embodiment uses a thru-silicon via technology to interconnect both internal plane structures as well as external structures (on the back-side of the die).

DETAILED DESCRIPTION OF THE PREFERRED EMBODIMENTS

What we disclose is an enhancement to the inductance/area of on-chip inductance structures like T-coils and inductors. An embodiment of this invention enhances a T-coil as illustrated in this disclosure as well as generic BEOL inductors.

One embodiment uses silicon through via technology to create a via through the metal layers in a chip that is approximately 10-20 um in diameter. T-coil solutions show a center gap between the "coils" of metal of around 10-20 um.

Figure 1:
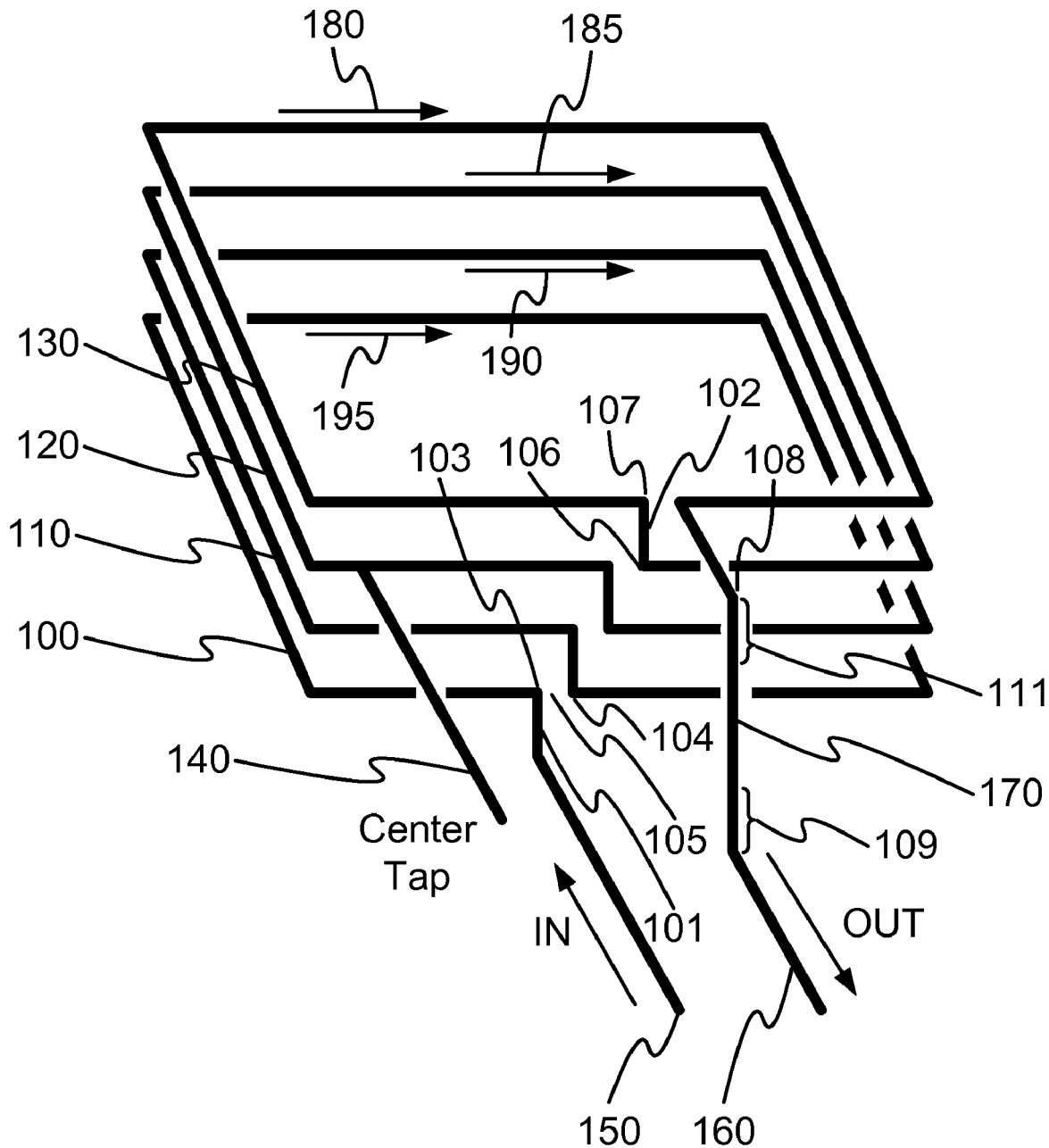
FIG. 1 is a schematic of a T-coil

A layout example of a T-coil is shown in FIG. 1; the coil structure is constructed by Metal 1 (100), Metal 2 (110), Metal 3 (120) and Metal 4 (130). The stacked multi-ring structure depicted in FIG. 1, has an input electrode (150) and an output electrode (160). The output path in the Figure is depicted by the item (170) which connects to the output electrode and the Center Tap is shown as item (140). The current flow through the coil is shown by arrows (180, 185, 190 and 195).

Figure 2:
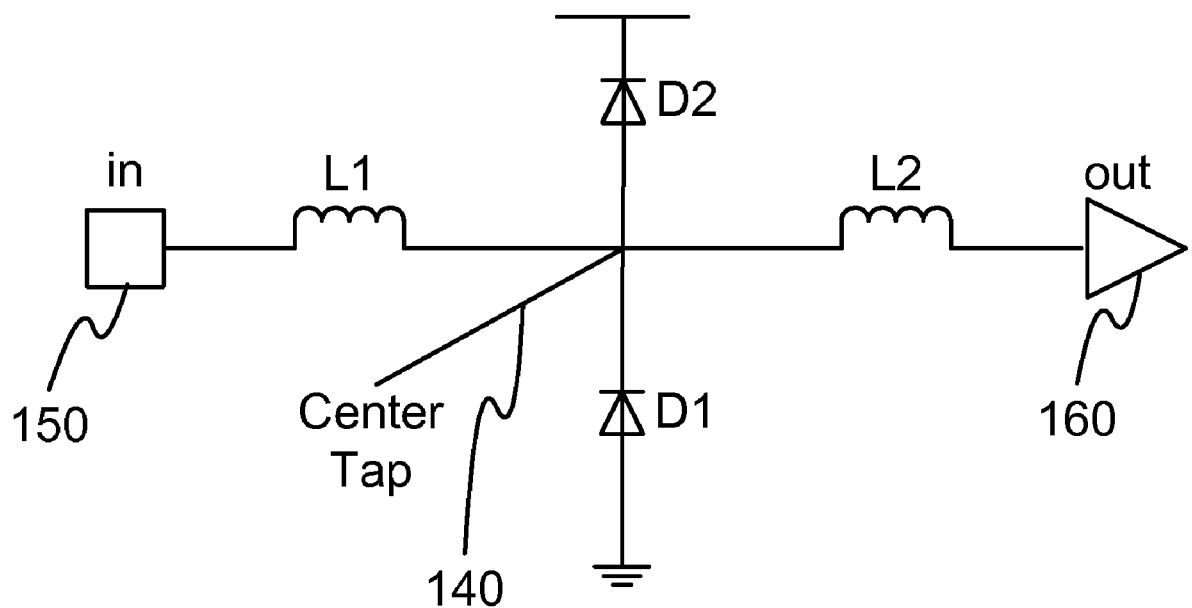
FIG. 2 is a schematic of a T-coil used to compensate for the ESD.

FIG. 2 shows a schematic diagram where a T-coil is used to compensate for the capacitance associated with electrostatic discharge (ESD) protection devices. Although two inductors (L1 and L2) are shown in FIG. 2, the center tap node is actually in the center of the layout view of FIG. 1.

An embodiment of the invention utilizes silicon through via technology. A metal via (300) is added down the center of the spiral, having the metal's permeability greater than the permeability of the BEOL dielectric material.

Figure 3:
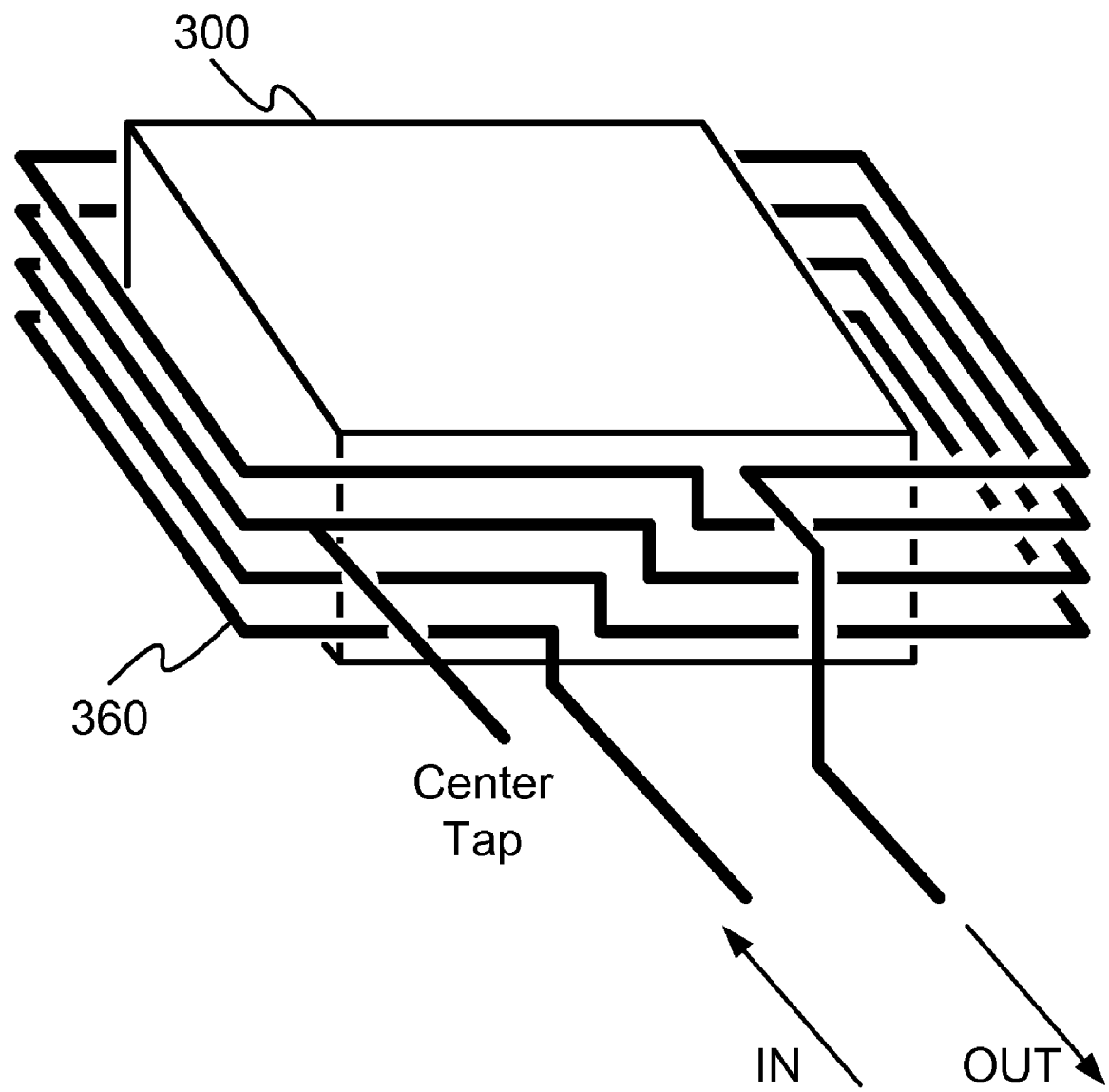
FIG. 3 shows the addition of magnetic material in the via at the center of coil

Further utilizing silicon through via technology, FIG. 3 is modified to look like FIG. 4 and the result is a Toroid built into the chip with the addition of a layer of magnetic material like Nickel above (400) and below (450) of the T-coil structure.

This allows the connection between the inner via and an array of outer vias. This material is added on a BEOL metal layer, or as an external "coating" on the finished silicon. An embodiment uses a ferrite material with proper thermal conduction properties.

The inductance adder per unit area is significant. Depending on the configuration and material used for the via, an increase in inductance of approximately two orders of magnitudes is expected by utilizing a nickel via core.

Another embodiment would be to construct an enhanced on-chip transformer using this new toroid configuration.

A large number of potential materials are used with this invention including all conductors that are consistent with the ionic control and thermal limitations of the silicon process technology and all dielectrics that can be deposited consistent with the thermal limitations. Deposition temperatures up to approximately 750 C seem acceptable but something on the order of 400 C is preferable.

One embodiment uses Ferrite material with the deposition and subsequent anneals up to a few hundred degrees C.

Given the inductor enhancement process insertion, the process adders for the concept shown in FIG. 3 include the via etch to define the opening for the high permeability materials, the deposition of the material itself and a chemical-mechanical polish off of the high permeability material outside the define via(s) area (300).

Figure 4:
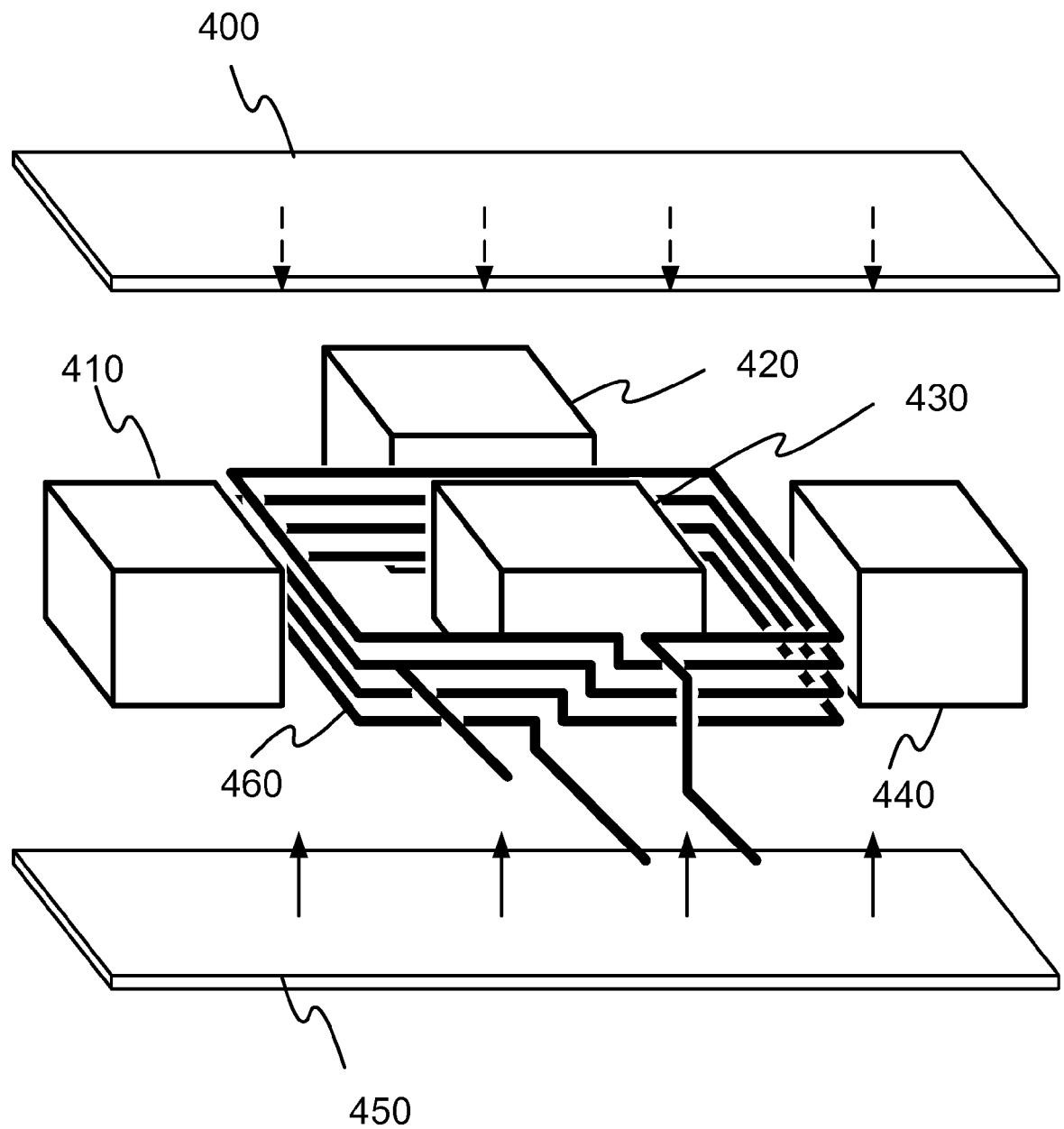
FIG. 4 shows the Tcoil construct in a Toroid configuration

An embodiment with an optimized Toroid configuration depicted in FIG. 4 includes additional processing for the deposition, definition and subtractive etch of the bottom high permeability film (450), a thick dielectric deposition after the final Toroidal metal film (130), followed by the steps required for the embodiment depicted in FIG. 3 to deposit high permeability material (300).

This step is comprised of filling the central core and the array of outer vias with high permeability metal depicted as depicted by FIG. 4 items 410, 420, 430 and 440, followed by another deposition, definition, subtractive etch sequence for the top high permeability film (400).

An embodiment of the invention is a method for enhancing inductance of an on-chip inductance structure, the method is comprised of:

Deposit and pattern a magnetic bottom layer (450) over a back-end-of-line metal layer or a finished portion of a chip. The magnetic bottom layer forms a bottom portion of the on-chip inductance structure in a toroid configuration.

Create a stacked multi-ring structure (460), wherein the stacked multi-ring structure is comprised of: an input electrode (150), an output electrode (160), an output path (170), a center tap (140), and a plurality of open rings (100, 110, 120, and 130); wherein the plurality of open rings are vertically stacked on the chip.

Each open ring is constructed by a ring fabrication process. The ring fabrication process deposits an inter-ring spacer layer, and removes (i.e., patterns) the inter-ring spacer layer to form a plurality of inter-ring spacer vias. The inter-ring spacer vias are filled with an inter-ring connector material (e.g., 101, 102, 109, 111). The process deposits and patterns a ring conductor film (e.g., 100, 110, 120, or 130) to form each open ring over the inter-ring spacer layer and the inter-ring spacer vias.

Each open ring has a first end (e.g., 103 or 107), a second end (e.g., 104 or 108), and one or more gaps (e.g., 105). The first end is located at a first via of the plurality of inter-ring spacer vias. If an open ring (e.g., 130) is above the lowest open ring (100) of the plurality of open rings, then a first portion of inter-ring connector material (102) in the first via connects the first end (107) to an end (106) of a lower open ring (120) of the plurality of open rings.

If an open ring is the lowest open ring (i.e., 100), then the first portion of inter-ring connector material (101) connects the first end (103) to the input electrode (150).

A second portion of inter-ring connector material (e.g., 109 or 111) in a second via of the plurality of inter-ring spacer vias forms a portion of the output path (170) used for connecting to the output electrode (160); and if the open ring is a highest open ring (130) of the plurality of open rings, then the second portion of inter-ring connector material (111) connects to the second end (108) of the open ring (130).

The center tap (140) connects to a middle ring (e.g., 120) of the plurality of open rings.

In this embodiment, a dielectric material is deposited, and a set of toroid vias are created in the layer of dielectric material to expose portions of the magnetic bottom layer (450), wherein a central core (300, 430) via through center of the stacked multi-ring structure (360, 460) is one of these toroid vias.

One or more toroid vias are placed outside of the stacked multi-ring structure (460). The embodiment fills the plurality of toroid vias with a magnetic material (e.g., as depicted in FIG. 4, items 410,420,430 and 440). In this example, the magnetic materials 410, 420, and 440 fill the toroid vias placed outside the stacked multi-ring structure.

The filling step is comprised of: depositing the magnetic material, and chemical-mechanical polishing of the magnetic material outside of the toroid vias. The magnetic material (410,420,430 and 440) in the toroid vias, and the stacked multi-ring structure (460) form a middle portion of the on-chip inductance structure in the toroid configuration. The last step of the process is to deposit and pattern a magnetic top layer (400) over the dielectric material and the magnetic material (410,420,430 and 440) in the toroid vias.

The magnetic top layer (400) connects the magnetic material and forms a top portion of the on-chip inductance structure in the toroid configuration. Each one of the magnetic material in the vias (410,420,430 and 440), the magnetic top layer (400), and the magnetic bottom layer (450) is a type of magnetic materials used in fabrication process. These magnetic type materials comprise: Nickel, Ferrite, and a material with higher permeability than the dielectric material.

A system, an apparatus, device, or an article of manufacture comprising one of the following items is an example of the invention: silicon, deposit material, patterns, inductance structure, stacked multi-ring, input electrode, output electrode, output path, center tap, open rings, inter-ring spacer layer, vias, spacer vias, ring conductor film, middle ring, toroid, toroid vias, dielectric material, magnetic material, central core via, chemical mechanical polishing material, Nickel, Ferrite, Tcoil, center tap or any other inductance enhancement system, applying the method mentioned above, for the purpose of the current invention or on-chip inductance structure utilizing silicon through via technology.

Any variations of the above teaching are also intended to be covered by this patent application.

The invention claimed is:

1. A method for enhancing inductance of an on-chip inductance structure, said method comprising:
    depositing and patterning a magnetic bottom layer over a back-end-of-line metal layer or a finished portion of a chip;
    wherein said magnetic bottom layer forms a bottom portion of said on-chip inductance structure in a toroid configuration;
    creating a stacked multi-ring structure, said stacked multi-ring structure comprising: an input electrode, an output electrode, an output path, a center tap, and a plurality of open rings;
    wherein said plurality of open rings are vertically stacked on said chip;
    wherein each open ring of said plurality of open rings is constructed by a ring fabrication process, said ring fabrication process comprising:
    depositing an inter-ring spacer layer,
    removing portions of said inter-ring spacer layer to form a plurality of inter-ring spacer vias,
    filling said plurality of inter-ring spacer vias with an inter-ring connector material, and
    depositing and patterning a ring conductor film to form said each open ring over said inter-ring spacer layer and said inter-ring spacer vias,
    wherein said each open ring has a first end, a second end, and one or more gaps,
    wherein said first end is located at a first via of said plurality of inter-ring spacer vias,
    wherein if said each open ring is above a lowest open ring of said plurality of open rings, then a first portion of the inter-ring connector material in said first via connects said first end to a third end of a lower open ring of said plurality of open rings,
    wherein if said each open ring is said lowest open ring, then said first portion of the inter-ring connector material connects said first end to said input electrode,
    wherein a second portion of the inter-ring connector material in a second via of said plurality of inter-ring spacer vias forms a portion of said output path used for connecting to said output electrode, and wherein if said each open ring is a highest open ring of said plurality of open rings, then said second portion of the inter-ring connector material connects to said second end;

wherein said center tap connects to a middle ring of said plurality of open rings;

depositing a dielectric material;

creating a plurality of toroid vias in said layer of dielectric material to expose portions of said magnetic bottom layer;

wherein a central core via through center of said stacked multi-ring structure is one of said plurality of toroid vias;

wherein one or more of said plurality of toroid vias is outside of said stacked multi-ring structure;

filling said plurality of toroid vias with a magnetic material;

wherein said filling step of filling the plurality of toroid vias comprises:

depositing said magnetic material, and chemical-mechanical polishing of said magnetic material outside said plurality of toroid vias;

wherein said magnetic material in said plurality of toroid vias and said stacked multi-ring structure form a middle portion of said on-chip inductance structure in said toroid configuration; and depositing and patterning a magnetic top layer over said dielectric material and said magnetic material in said plurality of toroid vias;

wherein said magnetic top layer connects said magnetic material and forms a top portion of said on-chip inductance structure in said toroid configuration; and wherein each one of said magnetic material, said magnetic top layer, and said magnetic bottom layer is a type of fabrication magnetic material that comprises at least one of: Nickel, Ferrite, and a material with higher permeability than said dielectric material.

* * * * *